(12) United States Patent
Agata et al.

(10) Patent No.: US 8,624,251 B2
(45) Date of Patent: Jan. 7, 2014

(54) ELECTRONIC PANEL

(75) Inventors: Kentaro Agata, Mobara (JP); Syou Yanagisawa, Mobara (JP); Megumi Oomori, Mobara (JP)

(73) Assignee: Japan Display Inc., Tokyo (JP)

( * ) Notice: Subject to any disclaimer, the term of this patent is extended or adjusted under 35 U.S.C. 154(b) by 100 days.

(21) Appl. No.: 13/430,742

(22) Filed: Mar. 27, 2012

(65) Prior Publication Data

US 2012/0248447 A1 Oct. 4, 2012

(30) Foreign Application Priority Data

Mar. 31, 2011 (JP) ................... 2011-079271

(51) Int. Cl.
*H01L 31/00* (2006.01)
*H01L 29/04* (2006.01)

(52) U.S. Cl.
USPC ............................................................. 257/59

(58) Field of Classification Search
USPC ................. 257/664–665, 734–786,
257/E29.111–E29.165, E23.01–E23.079,
257/E23.141–E23.179, 449, 40, 642–643,
257/759, E51.001–E51.052,
257/E25.008–E25.009, 223, 227, 291, 292,
257/439, 443, 655, E21.1, E27.175,
257/E27.112, E21.094, E21.104, E21.121,
257/E21.372, E21.411–E21.416, 59;
438/571, 597, 666, 29, 69, 82, 99, 149
See application file for complete search history.

(56) References Cited

U.S. PATENT DOCUMENTS 7,768,000 B2 * 8/2010 Cho et al. ........................ 257/40
8,252,626 B2 * 8/2012 Cho et al. ........................ 438/99

FOREIGN PATENT DOCUMENTS

JP 2005-236123 9/2005

* cited by examiner

*Primary Examiner* — Dao H Nguyen
*Assistant Examiner* — Tram H Nguyen
(74) *Attorney, Agent, or Firm* — Antonelli, Terry, Stout & Kraus, LLP.

(57) ABSTRACT

An electronic panel includes insulation films that cover metal wirings and have plated through holes which expose parts of the respective metal wirings, oxide semiconductor films that electrically conducted with the metal wirings via the plated through holes formed on the insulation films, and an electrical component that includes electrodes which are electrically connected to the oxide semiconductor films. The oxide semiconductor film includes first and second portions in which the widths thereof are different from each other. The width of the first portion is wider than the width of the second portion. A portion faces a part of the metal wiring which is exposed from the plated through hole, and the portion is electrically connected to the part of the metal wiring. At least a part of the second portion faces the electrode of the electrical component and is electrically connected to the electrode.

11 Claims, 6 Drawing Sheets

ELECTRONIC PANEL

CROSS-REFERENCE TO RELATED APPLICATION

The present application claims priority from Japanese application JP2011-079271 filed on Mar. 31, 2011, the contents of which are hereby incorporated by reference into this application.

BACKGROUND OF THE INVENTION

1. Field of the Invention

The present invention relates to an electronic panel such as a display panel or a touch panel.

2. Description of the Related Art

In an electronic panel, such as a liquid crystal display panel or a touch panel, a transparent electrode which is formed of an Indium Tin Oxide (ITO) film is used for a region through which light passes, the drain electrode, the source electrode and the gate electrode of a thin-film transistor are formed of a metal, and metal wirings are connected to the electrodes. The metal wiring includes terminals for connection with the outside, and the terminals are covered with the ITO film in order to prevent corrosion. In detail, plated through holes are formed in an insulation film which covers the terminals of the metal wiring, and the ITO film is formed to close up the plated through holes (JP2005-236123A). Therefore, the terminals of the metal wiring are designed to electrically connect to a connection unit, such as the bump of another electrical component, via the ITO film.

In order to electrically connect the ITO film to the metal wiring, the size of the plated through hole of the insulation film should be ensured. When the size of the plated through hole is increased, it is necessary to increase the size of the metal wiring and the ITO film which covers the metal wiring. Further, a predetermined degree of length should be ensured for the interval between the connection unit, such as the bump, which is arranged on a single terminal and the ITO film which is formed on a neighboring terminal in order to prevent a short circuit. Therefore, it is difficult to have correspondence to the narrow pitch of the connection unit in a conventional structure.

SUMMARY OF THE INVENTION

An object of the present invention is to provide an electronic panel which can correspond to a narrow pitch.

(1) An electronic panel according to an aspect of the invention includes a substrate, a plurality of metal wirings that are parallel on the substrate; insulation films that cover the plurality of metal wirings and that include plated through holes which expose parts of the respective metal wirings; oxide semiconductor films that are formed on the insulation films and are electrically connected to the respective metal wirings via the plated through holes; and an electrical component that includes electrodes which are electrically connected to the oxide semiconductor films. The oxide semiconductor film may be extended in the direction which is perpendicular to the arrangement direction of the plurality of metal wirings, and may include a first portion and a second portion in which the widths thereof are perpendicular to a lengthwise direction and are different from each other. The width of the first portion may be wider than the width of the second portion. A portion, in which at least both ends of the width of the first portion are removed, may face a part of the metal wiring which is exposed from the plated through hole, and the portion may be electrically connected to the part of the metal wiring. At least a part of the second portion may face the electrode of the electrical component and may be electrically connected to the electrode. According to the aspect of the invention, the oxide semiconductor film can correspond to the plurality of electrodes which are arranged with a narrow pitch because the width of the second portion which is electrically connected to the electrode of the electrical component is narrower than the width of the first portion which is electrically connected to the metal wiring via the plated through hole.

(2) In the electronic panel according to (1), the electrode may have a width in the direction which is parallel to that of the width of the second portion, and the width of a portion of the second portion which faces the electrode may be narrower than the width of the electrode.

(3) In the electronic panel according to (2), the portion of the second portion which faces the electrode may be a region over both ends of the width.

(4) In the electronic panel according to (3), the portion of the second portion which faces the electrode may be overlapped with the electrically connected metal wiring, and the width of each of the metal wirings may be wider than the width of the second portion in a position which is overlapped with the portion of the second portion which faces the electrode.

(5) In the electronic panel according to (4), the width of each of the metal wirings may be wider than the width of the electrode in the position which is overlapped with the portion of the second portion which faces the electrode.

(6) In the electronic panel according to (4), the width of each of the metal wirings may be narrower than the width of the electrode in the position which is overlapped with the portion of the second portion which faces the electrode.

(7) In the electronic panel according to (6), each of the plurality of metal wirings may have the same relative position as the second portion which is arranged to be overlapped therewith.

(8) In the electronic panel according to (7), the electrical component may include the plurality of electrodes in the same planar shape, and each of the plurality of metal wirings that is arranged to have the same relative position as the second portion may have the same planar shape.

(9) In the electronic panel according to any one of (1) to (8), the plated through holes which expose parts of neighboring metal wirings may be arranged at positions which deviate in the longitudinal direction of the plurality of metal wirings such that the plated through holes are not adjacent to each other in the arrangement direction of the plurality of metal wirings.

(10) In the electronic panel according to any one of (1) to (9), the electrode may be a bump.

(11) The electronic panel according to any one of (1) to (10) may further include an anisotropic conductive material that is interposed between the electrical component and the substrate, and the conductive particles of the anisotropic conductive material may be interposed between the second portion of the oxide semiconductor film and the electrode.

DETAILED DESCRIPTION OF THE INVENTION

Figure 1:
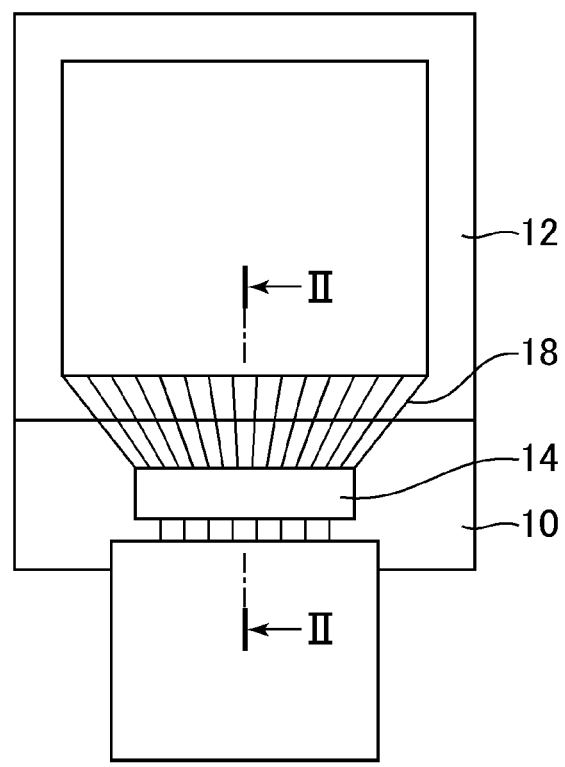
FIG. 1 is a plan view illustrating an electronic panel according to an embodiment of the present invention.
Figure 2:
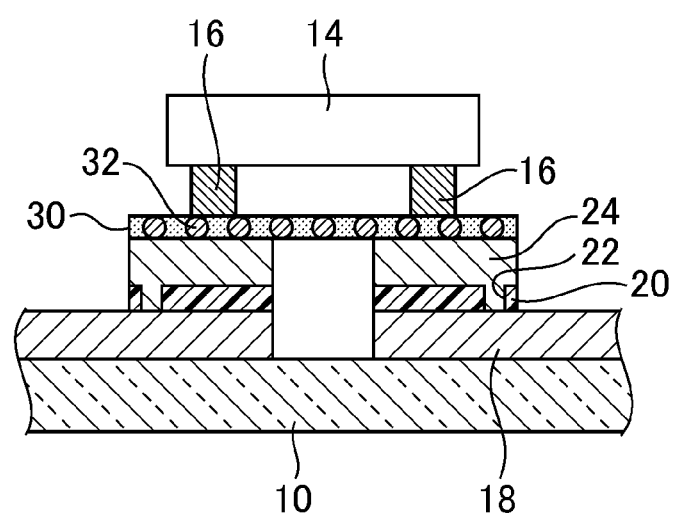
FIG. 2 is an enlarged view illustrating a cross-section taken along the line II-II of the electronic panel shown in FIG. 1.

Hereinafter, an embodiment of the present invention will be described with reference to the accompanying drawings. FIG. 1 is a plan view illustrating an electronic panel according to the embodiment of the present invention. FIG. 2 is an enlarged view illustrating a cross-section taken along the line II-II of the electronic panel shown in FIG. 1.

The electronic panel shown in FIG. 1 is a liquid crystal display panel. The liquid crystal display panel includes a pair of substrates 10 and 12 (both are glass substrates), and liquid crystal which is not shown is interposed therebetween. One substrate 10 is a Thin Film Transistor (TFT) substrate (or an array substrate) which includes a thin-film transistor, a pixel electrode and a wiring, and the other substrate 12 is a color filter substrate. A method of driving the liquid crystal display panel may be any one of an In Plane Switching (IPS) method, a Twisted Nematic (TN) method, and a Vertical Alignment (VA) method, and an electrode and a wiring are formed based on the method.

The electronic panel is not limited to the liquid crystal display panel. The electronic panel may be another display panel, such as an organic electroluminescence panel, or may be a touch panel. In any illustrative example, the electronic panel includes the substrate 10. On the electronic panel (in detail, the substrate 10), an electrical component 14 is provided. Although the electrical component 14 shown in FIG. 1 is an integrated-circuit chip, the electrical component 14 may be a flexible wiring substrate. The electrical component 14 includes electrodes 16. Although the electrodes 16 shown in FIG. 2 are bumps, the electrodes may be pads which do not have projections.

The electronic panel includes a plurality of metal wirings 18. In an example shown in FIG. 1, the plurality of metal wirings 18 includes gate wirings which are connected to the gate electrode of a thin-film transistor which is not shown. The plurality of metal wirings 18 is arranged on the substrate 10 in parallel. Although the neighboring metal wirings 18 may not be extended in parallel, the neighboring metal wirings 18 are arranged side by side.

Figure 3:
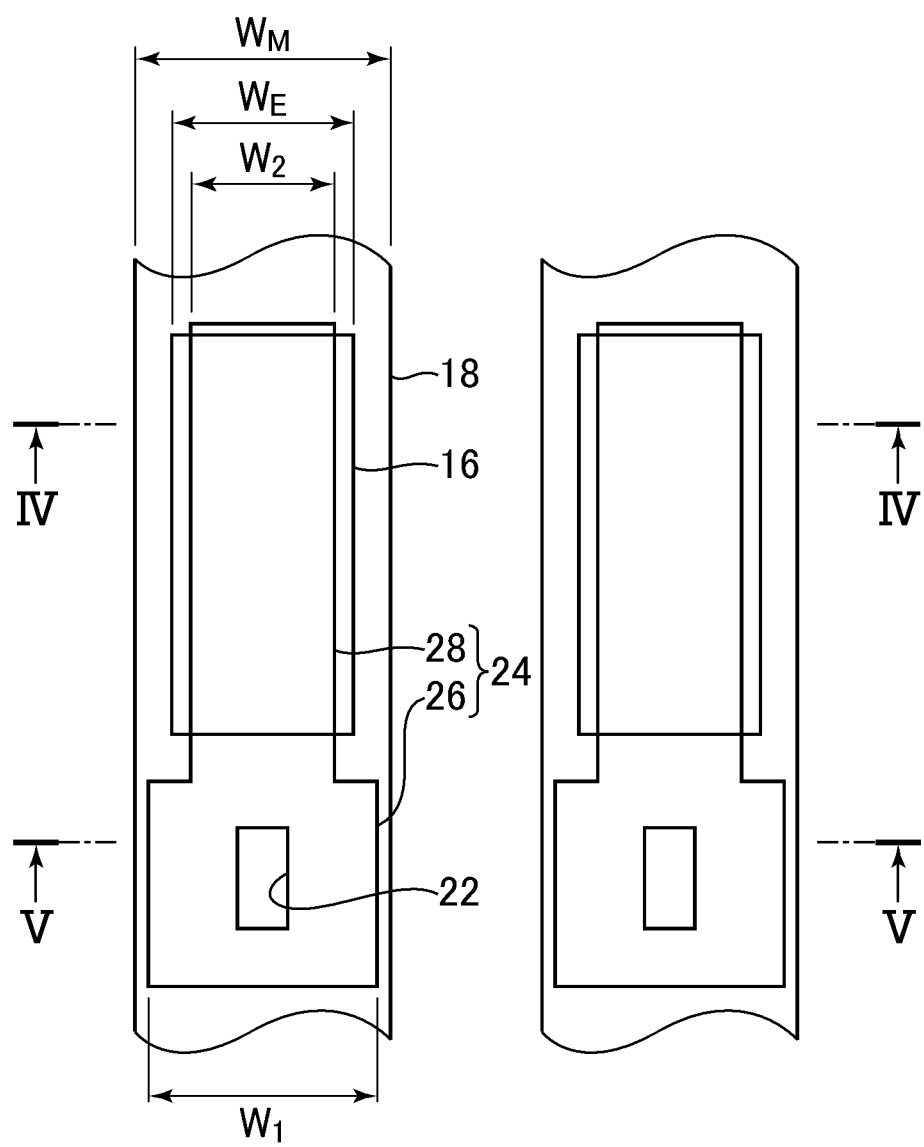
FIG. 3 is a plan view illustrating metal wirings and the configuration thereof.
Figure 4:
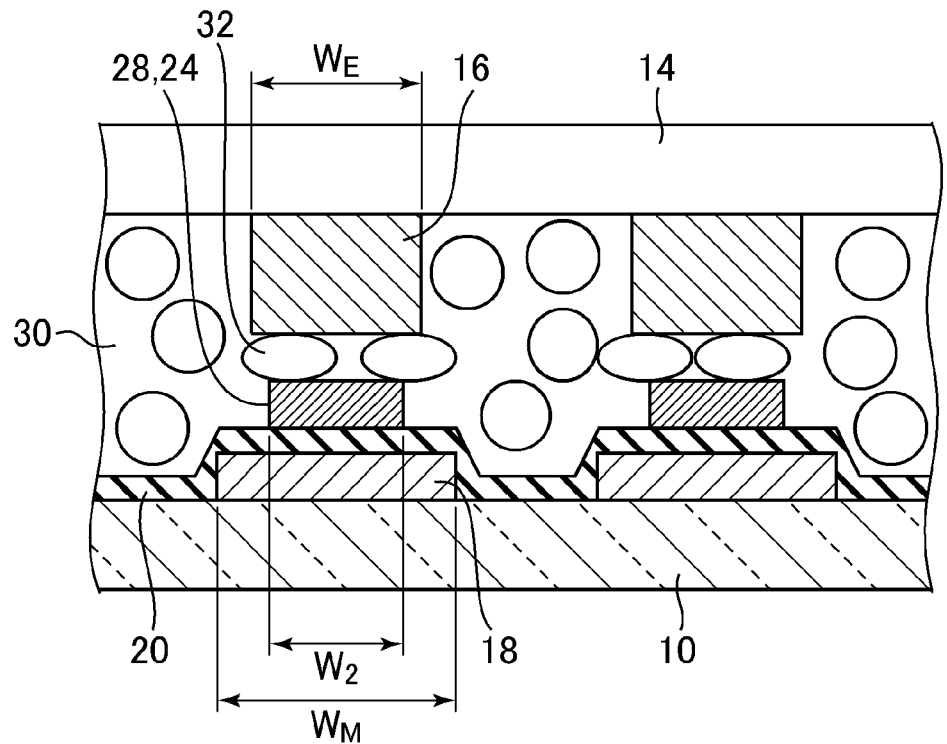
FIG. 4 is a cross-section view taken along the line IV-IV of the configuration shown in FIG. 3.
Figure 5:
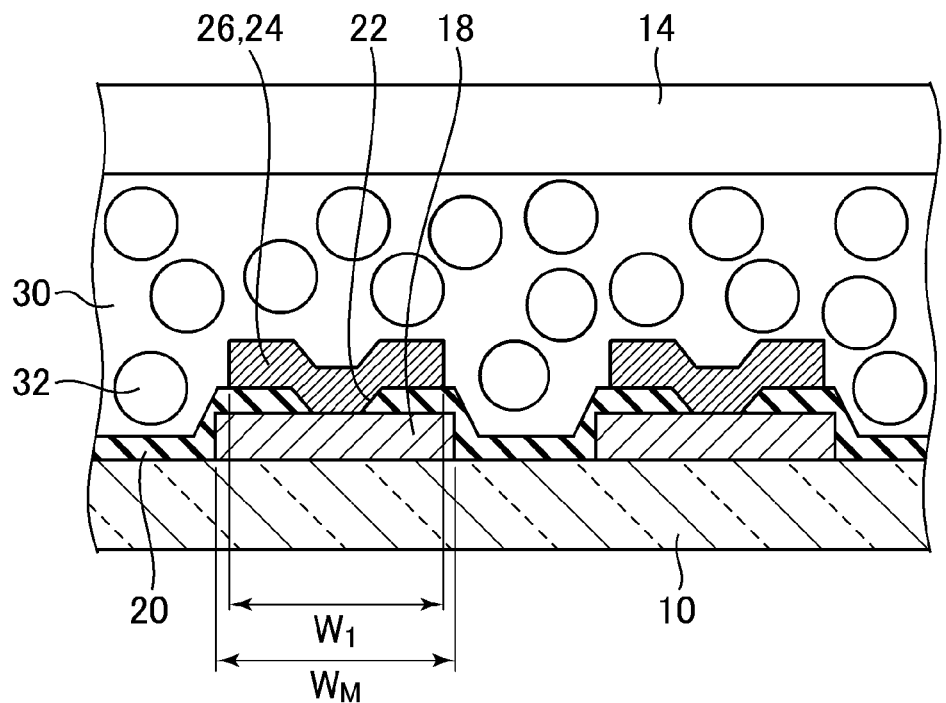
FIG. 5 is a cross-section view taken along the line V-V of the configuration shown in FIG. 3.

FIG. 3 is a plane view illustrating metal wirings 18 and the configuration thereof. FIG. 4 is a cross-section view taken along the line IV-IV of the configuration shown in FIG. 3. FIG. 5 is a cross-section view taken along the line V-V of the configuration shown in FIG. 3.

The plurality of metal wirings 18 is covered with insulation films 20 which are formed of an inorganic material, such as $SiO_2$ or SiN, or an organic material, such as a resin. The insulation film 20 includes a plurality of plated through holes 22. The plated through hole 22 exposes a part of the metal wiring 18.

On the insulation films 20, a plurality of oxide semiconductor films 24 are formed. The oxide semiconductor film 24 is formed of, for example, Indium Tin Oxide (ITO) or Indium Zinc Oxide, which has been known as a transparent electrode material. The oxide semiconductor film 24 is electrically conducted to the metal wiring 18 through the plated through hole 22. Meanwhile, the plated through hole 22 is completely covered with the oxide semiconductor film 24.

The oxide semiconductor film 24 is extended in the direction (in the vertical direction in FIG. 3) which is perpendicular to the arrangement direction of the plurality of metal wirings 18 (in the horizontal direction in FIG. 3). The oxide semiconductor film 24 includes a first portion 26 and a second portion 28 in which widths, which are perpendicular to a lengthwise direction, are different from each other. The width $W_1$ of the first portion 26 is wider than the width $W_2$ of the second portion 28. A portion, in which at least both ends of the width of the first portion 26 are removed, faces a part of the metal wiring 18 which is exposed from the plated through hole 22, and the portion is electrically connected to a part of the metal wiring 18. The first portion 26 comes into contact with the metal wiring 18 via the plated through hole 22.

The electrode 16 (for example, the bump) of the electronic panel has a width $W_E$ in the direction which is parallel to that of the width $W_2$ of the second portion 28. The electrode 16 is electrically connected to the oxide semiconductor film 24. At least a part of the second portion 28 faces and is electrically connected to the electrode 16 of the electrical component 14. An anisotropic conductive material 30 is interposed between the electrical component 14 and the substrate 10. Conductive particles 32 of the anisotropic conductive material 30 are interposed between the second portion 28 of the oxide semiconductor film 24 and the electrode 16. The conductive particles 32 come into contact with the second portion 28 and the electrode 16.

The entire region over both ends of the width $W_2$ of the second portion 28 corresponds to a portion of the second portion 28 which faces the electrode 16. The width $W_2$ of the portion of the second portion 28 which faces the electrode 16 is narrower than the width $W_E$ of the electrode 16. The portion of the second portion 28 which faces the electrode 16 is overlapped with the metal wiring 18 which is electrically connected to the second portion 28. The width $W_M$ of the metal wiring 18 is wider than the width $W_2$ of the second portion 28 at a position which is overlapped with the portion of the second portion 28 which faces the electrode 16. The width $W_M$ of the metal wiring 18 is wider than the width $W_E$ of the electrode 16 at a position which is overlapped with the portion of the second portion 28 which faces the electrode 16. When the width $W_M$ of the metal wiring 18 is widened, the region of the insulation film 20 which faces the electrode 16 can be planarized.

According to the embodiment, the oxide semiconductor film 24 can correspond to the plurality of electrodes 16 which are arranged with a narrow pitch because the width $W_2$ of the second portion 28 which is electrically connected to the electrode 16 of the electrical component 14 is narrower than the width $W_1$ of the first portion 26 which is electrically connected to the metal wiring 18 via the plated through hole 22.

Meanwhile, although the above description corresponds to an example in which the present invention is applied to the side of output (the side of output to an image display region) from the electrical component 14, the present invention may be applied to the side of input (the side of input from the outside) to the electrical component 14.

Figure 6:
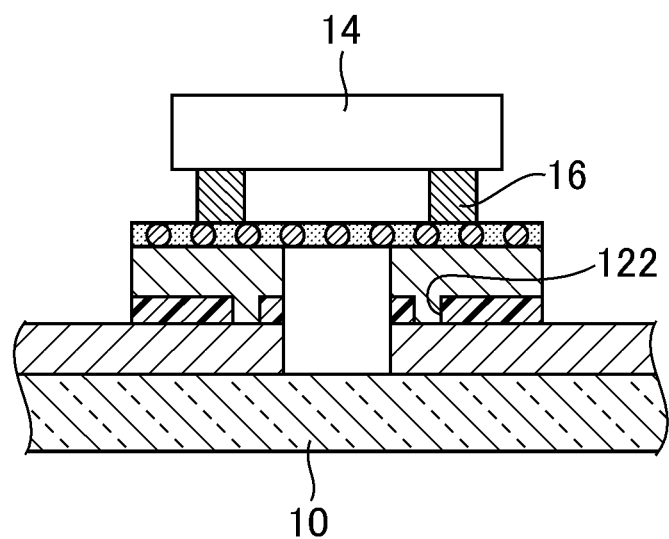
FIG. 6 is a view illustrating a first modification of the embodiment.

FIG. 6 is a view illustrating a first modification of the embodiment. In the above-described example shown in FIG. 2, the plated through holes 22 are positioned in the outer side of the region (projection domain) which faces the electrical component 14. In contrast, in an example shown in FIG. 6, plated through holes 122 are positioned in the inner side of the region (projection domain) which faces the electrical component 14. Further, the plated through holes 122 are formed in the central side of the electrical component 14 compared to the electrode 16.

Figure 7:
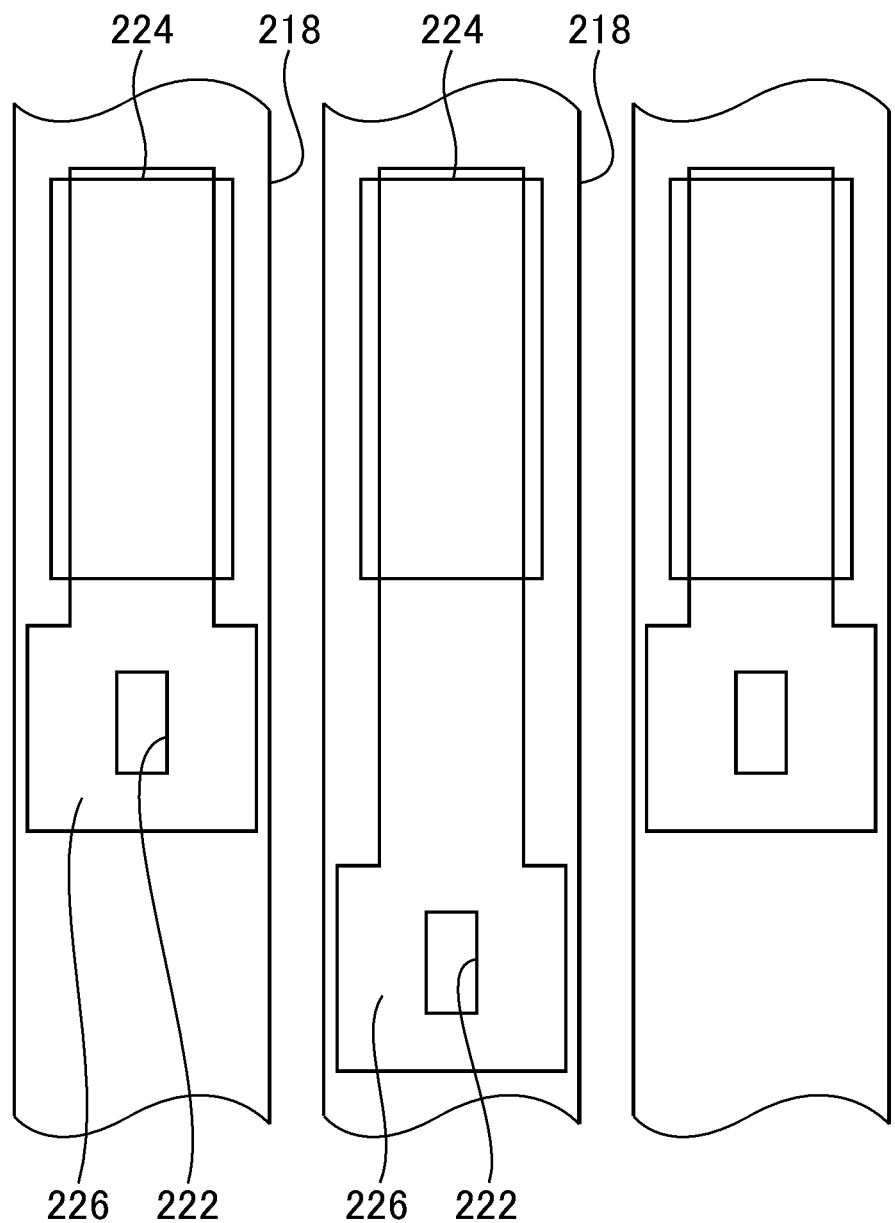
FIG. 7 is a view illustrating a second modification of the embodiment.

FIG. 7 is a view illustrating a second modification of the embodiment. In this example, a plurality of plated through holes 222 are arranged in a zigzag. In detail, the plated through holes 222 which expose parts of neighboring metal wiring 218 are arranged at positions which deviate in the longitudinal direction of the plurality of metal wirings 218 (the vertical direction in FIG. 7) such that the plated through holes 222 are not adjacent to each other in the arrangement direction (the horizontal direction in FIG. 7) of the plurality of metal wirings 218. According to this, first portions 226 of neighboring oxide semiconductor films 224 are arranged at positions which deviate in the longitudinal direction of the plurality of metal wirings 218 (the vertical direction in FIG. 7) such that the first portions 226 are not adjacent to each other in the arrangement direction (the horizontal direction in FIG. 7) of the plurality of metal wirings 218. Therefore, even when the interval between the neighboring oxide semiconductor films 224 is narrow, the short circuit of the neighboring first portions 226 can be prevented.

Figure 8:
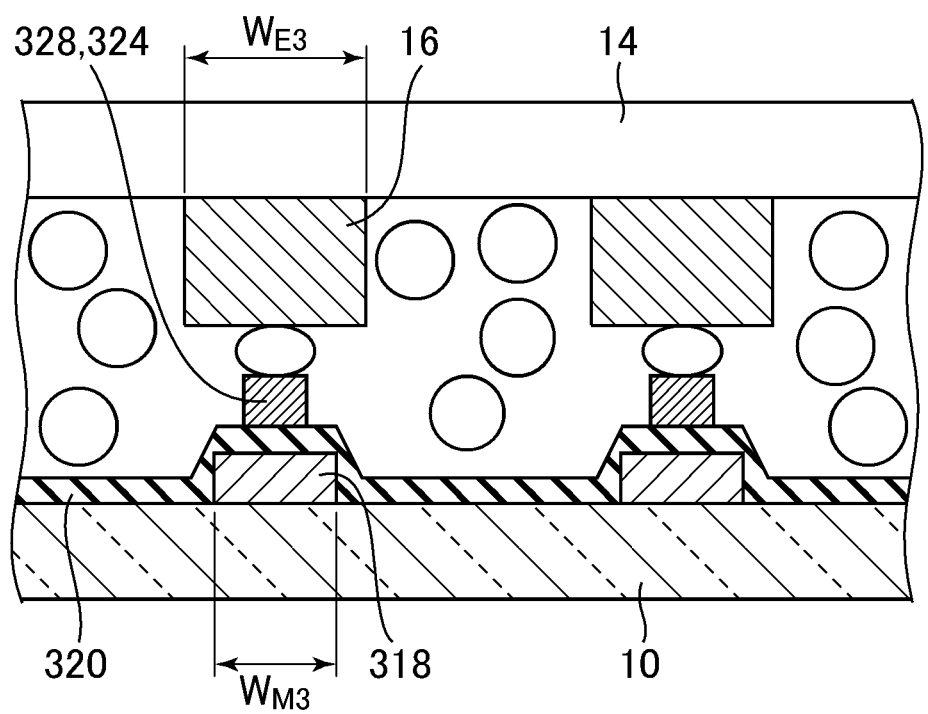
FIG. 8 is a view illustrating a third modification of the embodiment.

FIG. 8 is a view illustrating a third modification of the embodiment. In FIG. 8, a portion of a second portion 328 of an oxide semiconductor film 324, which faces the electrode 16, is shown. In this position, a width $W_{M3}$ of a metal wiring 318 is narrower than a width $W_{E3}$ of the electrode 16. When the width $W_{M3}$ of the metal wiring 318 is narrowed, the pitch of the neighboring metal wirings 318 can be narrowed.

Each of a plurality of metal wirings 318 has the same relative position as the second portion 328 which is arranged to overlap with the metal wiring. For example, the second portion 328 is formed to pass through the upside of the central portion of the metal wiring 318. Further, each of the plurality of metal wirings 318, which is arranged to have the same relative position as the second portion 328, has the same planar shape.

In this way, a convex portion, which is formed on the surface of an insulation film 320 to correspond to the metal wiring 318, and a convex shape, which is constructed by the external shape of the second portion 328, is uniformized with respect to each of the metal wirings 318. Therefore, the shapes of target surfaces on which the plurality of electrodes 16 are bonded are uniformized with respect to the respective electrodes 16. That is, pressures, applied to the plurality of electrodes 16 which are electrically connected to the plurality of second portion 328, respectively, are uniformized. Meanwhile, it is assumed that the plurality of electrodes 16 of the electrical component 14 have the same planar shapes.

The present invention is not limited to the above-described embodiment and various modifications are possible. For example, the configuration described in the embodiment can be replaced by substantially the same configuration, a configuration which accomplishes the same effect, or a configuration which can implement the same aspect.

What is claimed is:

1. An electronic panel, comprising:
   a substrate;
   a plurality of metal wirings that are parallel on the substrate;
   insulation films that cover the plurality of metal wirings and include plated through holes which expose parts of the respective metal wirings;
   oxide semiconductor films that are formed on the insulation films and are electrically connected to the respective metal wirings via the plated through holes; and
   an electrical component that includes electrodes that are electrically connected to the oxide semiconductor films,
   wherein the oxide semiconductor film is extended in a direction which is perpendicular to an arrangement direction of the plurality of metal wirings, and includes a first portion and a second portion in which widths are perpendicular to a lengthwise direction and are different from each other, the width of the first portion being wider than the width of the second portion,
   wherein a portion, in which at least both ends of the width of the first portion are removed, faces a part of the metal wiring which is exposed from the plated through hole, and the portion is electrically connected to the part of the metal wiring, and
   wherein at least a part of the second portion faces the electrode of the electrical component and is electrically connected to the electrode.

2. The electronic panel according to claim 1,
   wherein the electrode has a width in a direction which is parallel to that of the width of the second portion, and
   wherein the width of a portion of the second portion which faces the electrode is narrower than the width of the electrode.

3. The electronic panel according to claim 2,
   wherein the portion of the second portion which faces the electrode is a region over both ends of the width.

4. The electronic panel according to claim 3,
   wherein the portion of the second portion which faces the electrode is overlapped with the electrically connected metal wiring, and
   wherein a width of each of the metal wirings is wider than the width of the second portion in a position which is overlapped with the portion of the second portion which faces the electrode.

5. The electronic panel according to claim 4,
   wherein the width of each of the metal wirings is wider than the width of the electrode in the position which is overlapped with the portion of the second portion which faces the electrode.

6. The electronic panel according to claim 4,
   wherein the width of each of the metal wirings is narrower than the width of the electrode in the position which is overlapped with the portion of the second portion which faces the electrode.

7. The electronic panel according to claim 6,
   wherein each of the plurality of metal wirings has a same relative position as the second portion which is arranged to be overlapped therewith.

8. The electronic panel according to claim 7,
   wherein the electrical component includes the plurality of electrodes in a same planar shape, and
   wherein each of the plurality of metal wirings that is arranged to have the same relative position as the second portion has a same planar shape.

9. The electronic panel according to claim 1,
   wherein the plated through holes that expose parts of neighboring metal wirings are arranged at positions which deviate in a longitudinal direction of the plurality of metal wirings such that the plated through holes are not adjacent to each other in the arrangement direction of the plurality of metal wirings.

10. The electronic panel according to claim 1,
    wherein the electrode is a bump.

11. The electronic panel according to claim 1, further comprising:
    an anisotropic conductive material that is interposed between the electrical component and the substrate, wherein conductive particles of the anisotropic conductive material are interposed between the second portion of the oxide semiconductor film and the electrode.

\* \* \* \* \*